United States Patent [19]
Ball et al.

[11] Patent Number: 5,920,769
[45] Date of Patent: Jul. 6, 1999

[54] METHOD AND APPARATUS FOR PROCESSING A PLANAR STRUCTURE

[75] Inventors: Michael B. Ball; Steve W. Heppler, both of Boise, Id.

[73] Assignee: Micron Technology, Inc., Boise, Id.

[21] Appl. No.: 08/990,072

[22] Filed: Dec. 12, 1997

[51] Int. Cl.[6] .......................... H01L 21/44; H01L 21/48; H01L 21/50
[52] U.S. Cl. ........................ 438/113; 438/106; 438/110
[58] Field of Search .................................. 438/113, 106, 438/110

[56] References Cited

U.S. PATENT DOCUMENTS

| | | | |
|---|---|---|---|
| 4,016,855 | 4/1977 | Mimata | 125/13 |
| 4,753,049 | 6/1988 | Mori | 51/131.3 |
| 5,000,811 | 3/1991 | Campanelli | 438/113 |
| 5,534,102 | 7/1996 | Kadono et al. | 438/113 |
| 5,534,106 | 7/1996 | Cote et al. | 156/636.1 |
| 5,545,076 | 8/1996 | Yun et al. | 451/287 |
| 5,567,199 | 10/1996 | Huber et al. | 451/398 |
| 5,632,667 | 5/1997 | Earl et al. | 451/141 |
| 5,654,226 | 8/1997 | Temple et al. | 438/458 |
| 5,656,553 | 8/1997 | Leas et al. | 438/458 |
| 5,667,433 | 9/1997 | Mallon | 451/287 |
| 5,679,060 | 10/1997 | Leonard et al. | 451/143 |

*Primary Examiner*—Kevin M. Picardat
*Assistant Examiner*—Deven Collins
*Attorney, Agent, or Firm*—Dickstein Shapiro Morin & Oshinsky LLP

[57] ABSTRACT

A method and apparatus are provided for handling planar structures, such as semiconductor wafers, with reduced breakage and cracking. The method includes the step of segmenting a wafer prior to grinding. The apparatus includes a segmented vacuum table for supporting wafer portions in position to be ground to a desired thickness. In another aspect of the invention, adhesive material is employed to individually secure wafer portions in position during the grinding process.

16 Claims, 4 Drawing Sheets

METHOD AND APPARATUS FOR PROCESSING A PLANAR STRUCTURE

BACKGROUND OF THE INVENTION

The present invention relates to a system for processing a planar structure, such as a semiconductor wafer. The invention also relates to a manufacturing method which includes the steps of segmenting a wafer into portions and then reducing the thickness of the segmented portions. The invention also relates to the segmented wafer portions themselves.

In a known manufacturing process, a plurality of integrated circuits are simultaneously patterned and defined on the front surface of a single silicon wafer. The circuits are generally aligned in rows and columns in an orthogonal format. After the circuits are fully defined, the wafer is diced by a sawing machine along lines between the rows and columns to separate the wafer into individual chips. The chips can then be secured within individual packages and/or incorporated into electronic devices.

In the known process, the silicon wafer is sliced from a generally cylindrical ingot. The wafer is at first sliced sufficiently thick enough so as not to warp or break during the formation of the integrated circuits. However, the desired thickness for the finished chips is less than the initial thickness of the sliced wafer. Therefore, after the integrated circuit patterns are defined in the wafer, it has been necessary to grind the back surface of the wafer to reduce its thickness as desired for the finished products.

Grinding machines for grinding down the back surfaces of silicon wafers are known in the art. The known machines have chuck tables for securing a plurality of wafers in position to be ground by one or more grinding wheels. Examples of such grinding machines are illustrated in U.S. Pat. No. 5,679,060 (Leonard), U.S. Pat. No. 4,753,049 (Mori), U.S. Pat. No. 5,632,667 (Earl), and U.S. Pat. No. 5,035,087 (Nishiguchi).

The known wafer processing systems are unsatisfactory, particularly for wafers of relatively large diameter and/or reduced thickness. Recently, silicon wafers having diameters of about thirty centimeters have come into commercial acceptance. These large diameter wafers are prone to breakage and cracking. The tendency of such wafers to break and crack during dicing substantially increases the expense of the fabrication process and reduces process yields. In general, the tendency toward breaking and cracking is proportional to the diameter of the wafer and inversely proportional to its thickness.

SUMMARY OF THE INVENTION

An object of the invention is to provide a method and apparatus wherein semiconductor wafers are segmented into smaller wafer portions prior to grinding.

Another object of the invention is to provide an improved wafer holding table for supporting segmented wafer portions during grinding.

Another object of the invention is to provide a system for producing semiconductor products from large diameter wafers with reduced warpage, breaking and cracking.

Another object of the invention is to provide an economical system for manufacturing integrated circuit chips from brittle semiconductor wafers.

According to one aspect of the invention, semiconductor wafers are segmented prior to being ground, and the segmented wafer portions are supported on a wafer holding table for grinding. By segmenting the wafers before reducing their thickness by grinding, the problem of wafers cracking and breaking during dicing is reduced.

The problem of cracking and breaking is particularly acute for large diameter silicon wafers and for wafers made of group III–V compound semiconductor materials such as GaAs, GaP and InP. The group III–V materials may be more brittle than Si based materials.

According to the present invention, semiconductor wafers may be segmented into various sizes. In a preferred embodiment, the wafers are segmented into quarter-sized segments. In this embodiment, each generally cylindrical wafer is segmented into four pie-shaped portions. In another preferred embodiment, the wafers are diced into individual dies prior to grinding, such that each die contains a single integrated circuit.

The present invention also relates generally to a method of handling planar structures. According to this aspect of the invention, a planar structure is separated into segmented portions, and then the segmented portions are ground down to a desired thickness. In one preferred aspect of the invention, the planar structure is a semiconductor wafer having integrated circuits defined therein.

In another aspect of the invention, a grinding wheel is used to grind down the back surfaces of segmented wafer portions to a desired thickness for packaging and/or further processing.

In another aspect of the invention, wafer portions are secured to a support surface by a vacuum. The vacuum may be applied through regions of porous material. The porous regions may be pie-shaped, like the wafer portions, to efficiently match the contours of the wafer portions.

In another embodiment of the invention, the wafer portions are held in place during grinding by a suitable adhesive material, such as a double sticky film.

The present invention is applicable to a wide variety of materials and products. The invention is not limited to the manufacture of semiconductor products. However, preferred embodiments of the invention are described herein in connection with semiconductor products with integrated circuits, and the invention may be particularly applicable to products formed of relatively brittle semiconductor materials such as GaAs, GaP and InP.

According to one aspect of the invention, finished integrated circuit products are ground down to a thickness of less than about fifteen mils. The present invention is particularly applicable to the manufacture of relatively thin products which would otherwise be prone to breakage and cracking during processing.

These and other objects, features and advantages of the invention will become apparent from the following detailed description of preferred embodiments of the present invention.

DETAILED DESCRIPTION OF PREFERRED EMBODIMENTS

Figure 1:
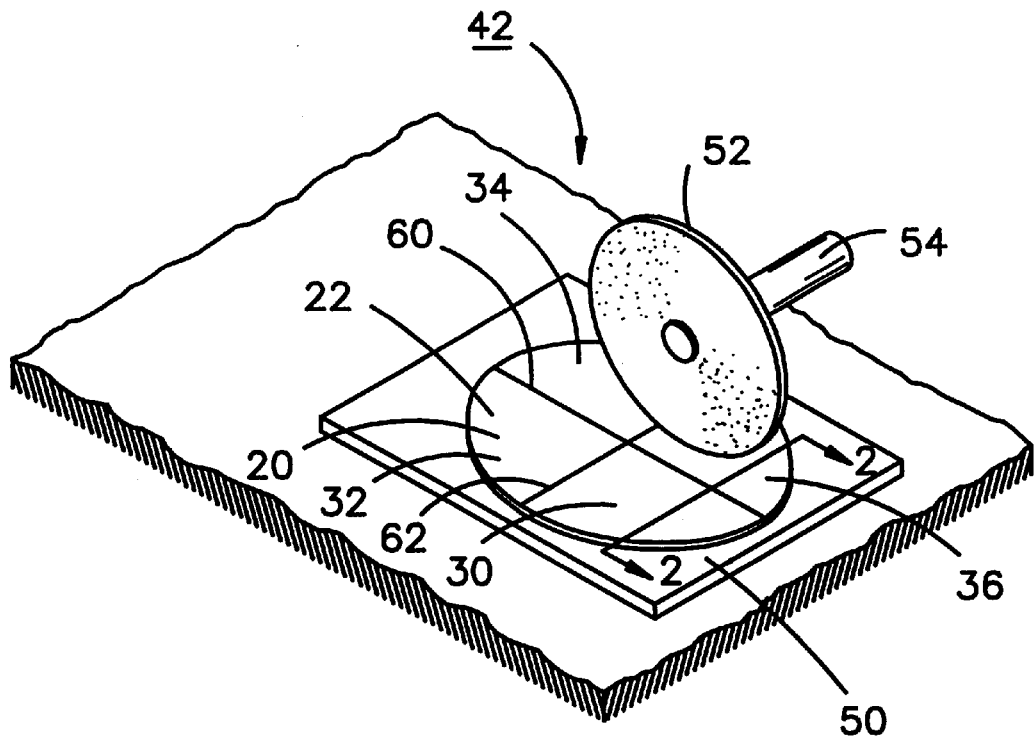
FIG. 1 is a perspective view of a wafer segmenting station constructed in accordance with the present invention.

Referring now to the drawings, where like reference numerals designate like elements, there is shown in FIGS. 1–7 a system for producing integrated circuit chips of a desired thickness from a generally cylindrical wafer 20.

In operation, protective material, such as polyimide tape or polyamide coatings, 22, 24 (FIG. 2) are applied to the front and back surfaces 26, 28 of the wafer 20. Then, the wafer 20 is segmented into quarter-sized wafer portions 30, 32, 34, 36. Then, the back protective coating 24 is removed from the wafer portions 30–36, and the wafer portions 30–36 are moved to a grinding apparatus by suitable pick and place equipment (not illustrated).

Figure 5:
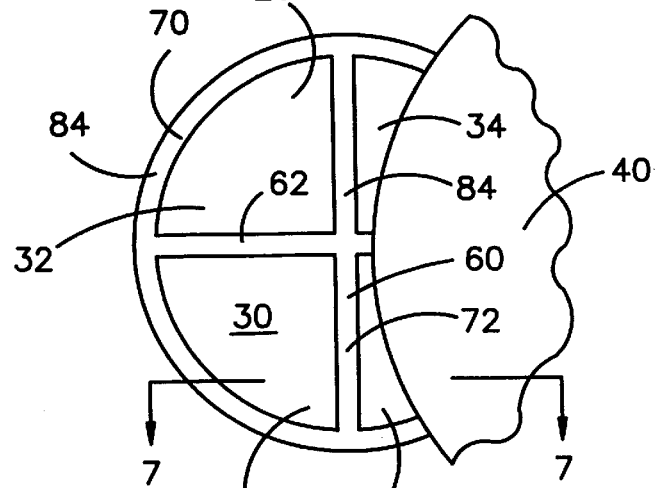
FIG. 5 is a plan view of the wafer holding table of FIG. 4, overlain by a grinding wheel.
Figure 6:
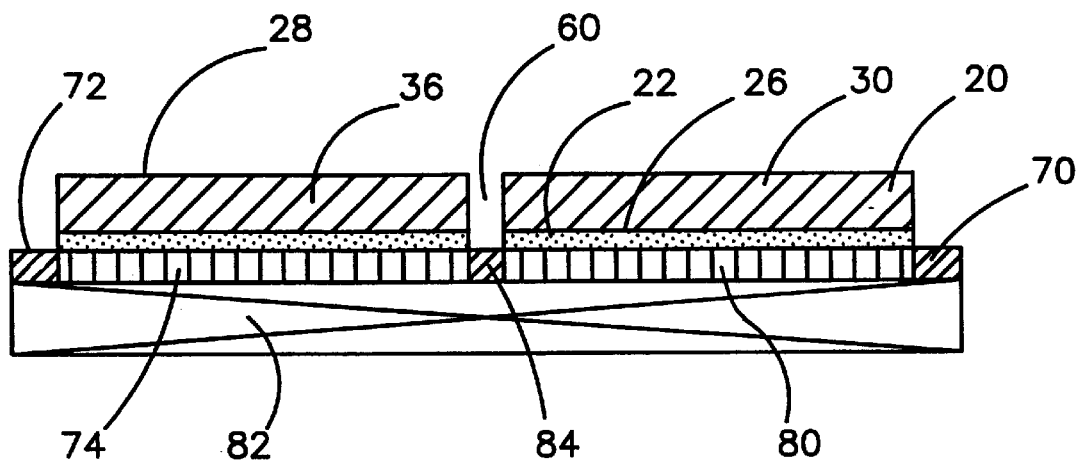
FIG. 6 is a cross sectional view taken along the line 6—6 of FIG. 4.
Figure 7:
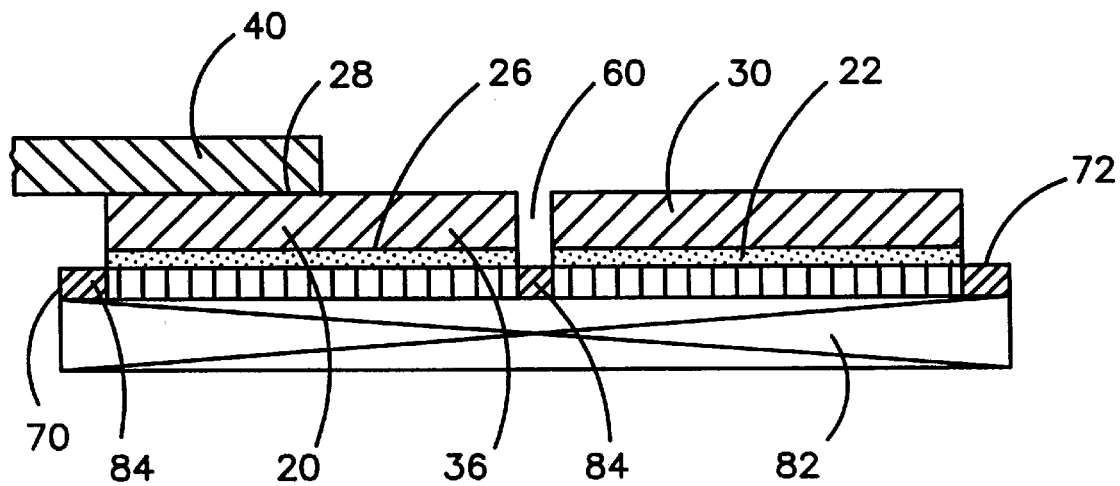
FIG. 7 is a cross sectional view taken along the line 7—7 of FIG. 5.

At the grinding apparatus, the back surfaces 28 of the wafer portions 30–36 are ground down by a suitable grinding wheel 40 (FIG. 5). The grinding process is continued until the wafer portions 30–36 have the desired thickness, which may be fifteen to twelve mils or less. The wafer portions 30–36 are held in place during the entire grinding process by suction, as described in more detail below. After the grinding process is completed, the wafer portions 30–36 are moved individually by suitable pick and place equipment (not illustrated) to another station (not illustrated) for removal of the front protective coatings 22, for dicing into individual chips, and for further processing.

Referring now to FIG. 1, a segmenting station 42 has a table 50 for supporting the wafer 20 during the segmenting process, and a rotating blade 52 for slicing completely through the wafer 20 and the protective coatings 22, 24. The blade 52 is operated (rotated and moved) by a suitable drive means 54. In the illustrated embodiment, the wafer 20 is sliced along first and second perpendicular segment lines 60, 62. The segment lines 60, 62 pass between four sets of integrated circuits (not shown) patterned in the front surface 26 of the wafer 20.

Figure 2:
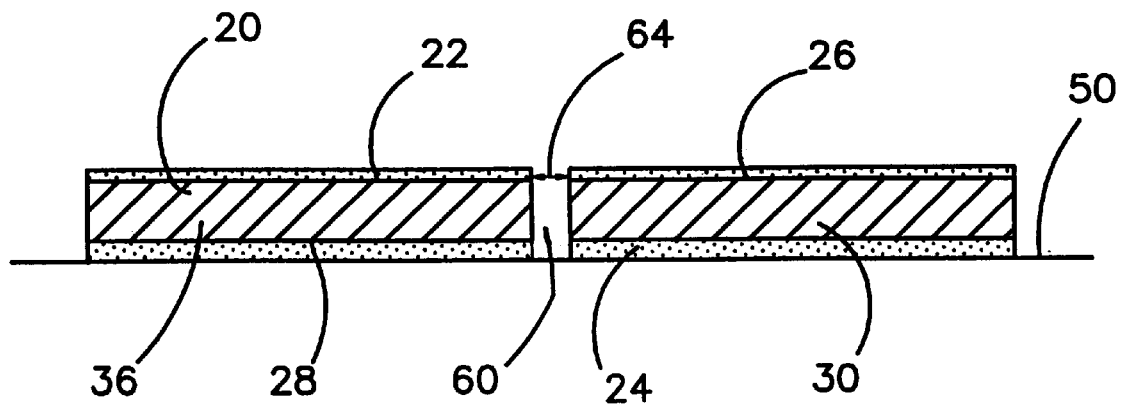
FIG. 2 is a cross sectional view of the wafer segmenting station of FIG. 1, taken along the line 2—2.

FIG. 1 shows the wafer 20 after the segmenting (or sawing) process has been completed. As shown in FIG. 2, the segmenting process causes the wafer portions 30–36 to be spaced apart from each other by a distance 64 which is slightly greater than the thickness of the rotating blade 52. An advantage of the invention is that grinding efficiency is improved by reducing the surface area of the wafer 20 prior to grinding.

Figure 3:
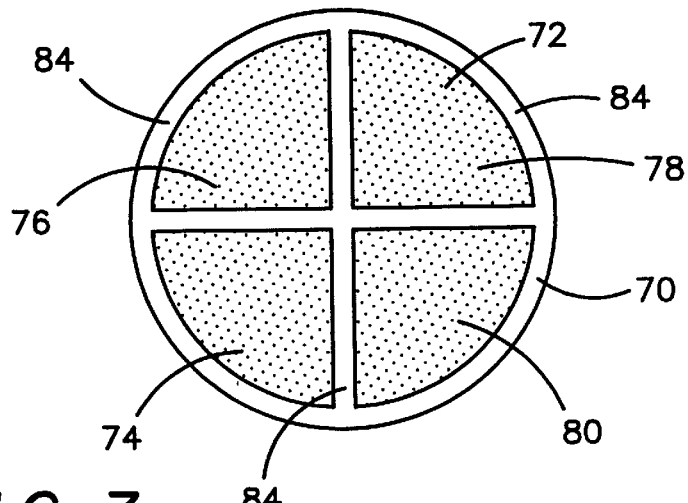
FIG. 3 is a plan view of a segmented wafer holding table constructed in accordance with the present invention.
Figure 4:
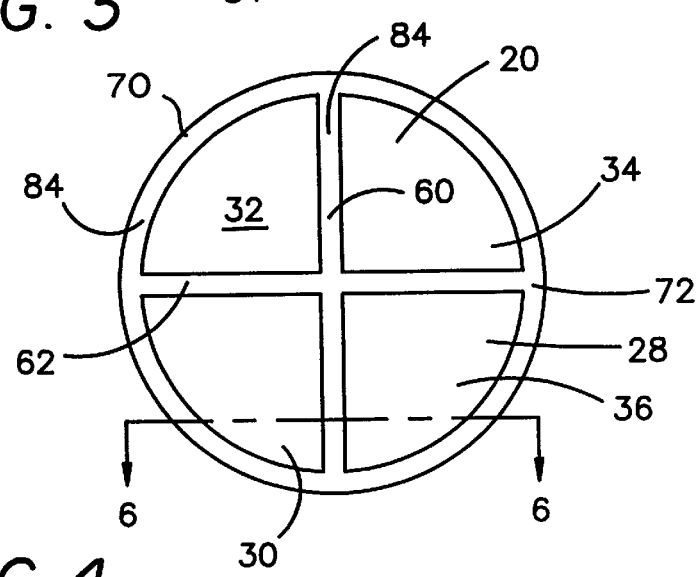
FIG. 4 is a plan view of the wafer holding table of FIG. 3, with the table shown supporting four segmented wafer portions.

Referring now to FIG. 3, the wafer grinding apparatus may have a plurality of movable wafer holding tables 70. For clarity of illustration, only one of the tables 70 is shown in the drawings. The other tables may be essentially the same as the illustrated table 70, and all of the tables 70 may be movable in a circular path through successive grinding stations, in a manner known in the art.

Each wafer holding table 70 has a support surface 72 and four porous ceramic regions 74, 76, 78, 80. The porous regions 74–80 provide communication between a vacuum source 82 (FIG. 6) and the front surfaces 26 of the wafer portions 30–36. The vacuum causes the wafer portions 30–36 to adhere firmly to the support surface 72 during the grinding operation so that the finished thickness of the wafer portions 30–36 can be carefully controlled.

In the illustrated embodiment, each porous region 74–80 is surrounded by non-porous regions 84. The respective outlines of the porous regions 74–80 correspond closely to the pie-shaped contours and circular periphery of the wafer portions 30–36. This way, the efficiency of the vacuum source 82 is maximized. By preventing vacuum from being wasted through the regions 64, 84 between the wafer portions 30–36, the vacuum source 82 can be-operated more efficiently.

Once positioned and secured on the holding table 70, the wafers 30–36 are ground down by the grinding wheel 40. Only one grinding wheel 40 is shown in the drawings. However, in practice, the wafer portions 30–36 may be moved to successive grinding stations with grinding wheels (not illustrated) of decreasing grain size and abrasiveness so that the roughness of the back surfaces 28 is successively decreased. Upon completion of the entire grinding operation, the wafers 30–36 are removed from the wafer grinding apparatus for cleaning, dicing, and further processing (such as packaging).

Figure 8:
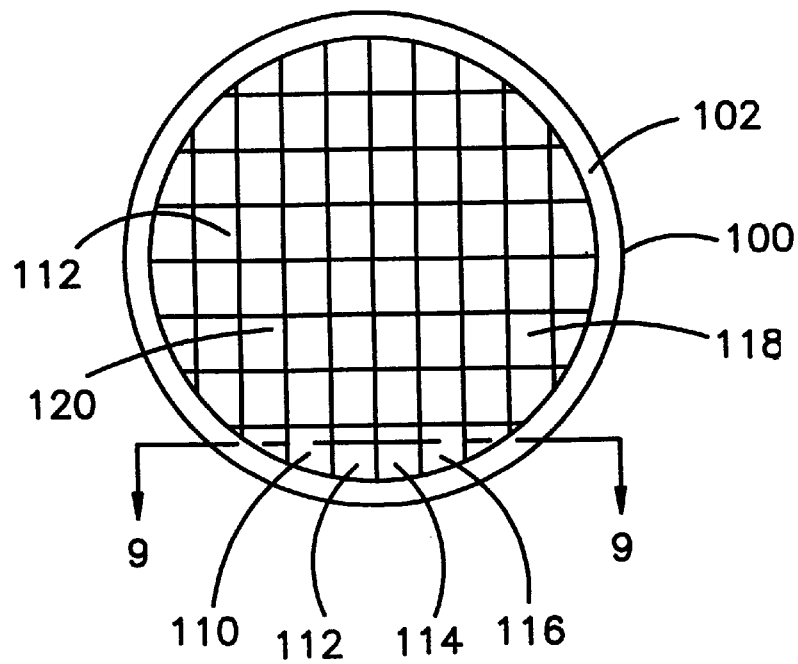
FIG. 8 is a plan view of another segmented wafer holding table constructed in accordance with the present invention.
Figure 9:
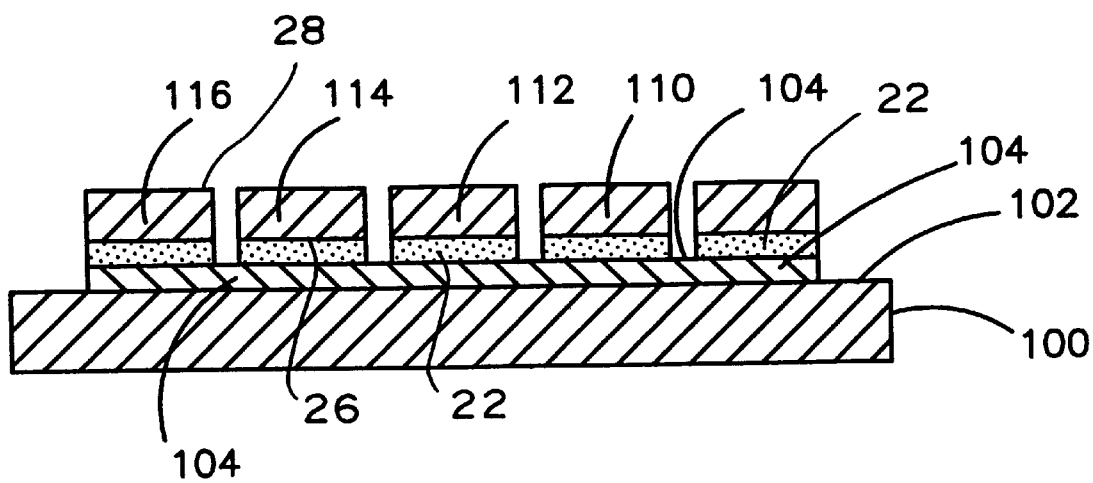
FIG. 9 is a cross sectional view taken along the line 9—9 of FIG. 8.

FIGS. 8 and 9 shows a wafer holding table 100 constructed in accordance with another embodiment of the invention. The table 100 has a support surface 102 and a double sticky film frame 104. The film frame 104 has a generally circular configuration with a diameter at least as great as that of the wafer 20. The film frame 104 adheres firmly to the surface 102 of the wafer holding table 100.

In operation, a wafer 20 is diced into individual die 110, 112, 114, 116, 118, 120, 122 by a segmenting apparatus 42 of the type shown in FIG. 1. The wafer 20 is segmented such that each segmented wafer portion 110–122 contains one of the integrated circuits patterned into the front surface 26. Then, the segmented die 110–122 are individually moved to the wafer holding table 100 by suitable pick and place equipment (not illustrated). The front surfaces 26 of the individual die 110–122 adhere firmly to the film 104. Then, all of the die 110–122 are simultaneously ground down to the desired thickness by one or more grinding wheels 40 of the type shown in FIG. 5.

After the grinding process, the individual die 110–122 are removed by suitable pick and place equipment (not illustrated) to another location for removal of the front protective tape or coating 22 and/or for other processing.

The present invention is not limited to the specific embodiments described above. For example, whereas the segmenting process is described above as forming four segments or a plurality of individual dies or pellets, the invention could also practiced by separating wafers into more or less segments. The type of segmenting selected may depend on the circuit pattern formed on the wafer. In addition, the four wafer segments 30–36 shown in FIG. 4 may be adhered to the wafer holding table 70 by sticky film, rather than by suction. Likewise, the individual die 110–122 shown in FIGS. 8 and 9 may be secured to the wafer holding table 100 by vacuum rather than by adhesive film.

The above descriptions and drawings are only illustrative of preferred embodiments which achieve the objects, features and advantages of the present invention, and it is not intended that the present invention be limited thereto. Any modification of the present invention which comes within the spirit and scope of the following claims is considered part of the present invention.

What is claimed as new and desired to be protected by Letters Patent of the United States is:

1. A method of processing a semiconductor wafer, said method comprising the steps of:

segmenting said semiconductor wafer into segmented portions, said segmented portions having front surfaces and opposed back surfaces, said front surfaces of said segmented portions having integrated circuits formed therein; and subsequently, grinding said back surfaces of said segmented portions to reduce the thicknesses of said segmented portions.

2. The method of claim 1, wherein said step of grinding said back surfaces of said segmented portions includes the step of applying a grinding wheel to said back surfaces.

3. The method of claim 2, further comprising the step of securing said front surfaces of said segmented portions to a support surface by vacuum during said grinding step.

4. The method of claim 3, wherein said support surface includes porous regions for supplying said vacuum to said front surfaces of said segmented portions.

5. The method of claim 4, wherein said porous regions are generally pie-shaped to match the contours of said segmented portions.

6. The method of claim 2, further comprising the step of using adhesive material to secure said segmented portions to a support surface during said grinding step.

7. The method of claim 1, wherein said semiconductor wafer includes silicon material.

8. The method of claim 1, wherein said semiconductor wafer includes GaAs, GaP or InP.

9. A method of processing a semiconductor wafer, said method comprising the steps of:

applying front and back protective material to the front and back surfaces of said wafer, respectively;

subsequently, segmenting said wafer into wafer portions;

subsequently, removing said back protective material; and subsequently, reducing the thickness of said wafer portions.

10. The method of claim 9, wherein said step of applying said protective material includes the step of forming a polyamide coating on said wafer.

11. The method of claim 9, wherein said wafer portions are ground to a thickness of no greater than about fifteen mils.

12. A method of manufacturing integrated circuit products, said method comprising the steps of:

providing a semiconductor wafer;

separating said wafer into wafer portions, each wafer portion having a front surface and a back surface, and wherein integrated circuits are located in said front surfaces of said wafer portions, and wherein each wafer portion has a thickness in the direction from the respective front surface to the respective back surface; and subsequently, reducing the thicknesses of said wafer portions.

13. The method of claim 12, wherein said step of separating said wafer into wafer portions includes the step of sawing said wafer into at least four pie-shaped segments.

14. The method of claim 13, further comprising the step of dicing said segments into individual chips, and wherein said dicing step occurs subsequent to said step of reducing the thicknesses of said wafer portions.

15. The method of claim 12, wherein said step of separating said wafer into wafer portions includes the step of dicing said wafer into individual chips, with each of said integrated circuits being located on a separate one of said chips.

16. A method of manufacturing integrated circuit products, said method comprising the steps of:

providing a semiconductor wafer having a front surface and a back surface, and a plurality of integrated circuits in said front surface;

separating said wafer into wafer portions, each wafer portion including at least one of said integrated circuits; and subsequently, reducing the thickness of said wafer portions; and wherein said step of separating said wafer into wafer portions includes the step of dicing said wafer into individual chips, with each of said integrated circuits being located on a separate one of said chips; and wherein said method further comprises the step of individually moving said chips into a grinding position to be ground, and subsequently individually moving said chips from said grinding position.

* * * * *